United States Patent
Wang et al.

(10) Patent No.: US 9,911,910 B2
(45) Date of Patent: Mar. 6, 2018

(54) HIGH TEMPERATURE SUPERCONDUCTOR TAPE WITH ALLOY METAL COATING

(71) Applicant: Varian Semiconductor Equipment Associates, Inc., Gloucester, MA (US)

(72) Inventors: Connie P. Wang, Mountain View, CA (US); Paul Sullivan, Wenham, MA (US); Paul Murphy, Reading, MA (US); Kasegn D. Tekletsadik, Middleton, MA (US); Bharatwaj Ramakrishnan, Fremont, CA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 101 days.

(21) Appl. No.: 14/013,313

(22) Filed: Aug. 29, 2013

(65) Prior Publication Data

US 2015/0065351 A1     Mar. 5, 2015

(51) Int. Cl.
*H01L 39/24* (2006.01)
*H01L 39/16* (2006.01)
*H01B 12/06* (2006.01)

(52) U.S. Cl.
CPC .......... *H01L 39/248* (2013.01); *H01L 39/16* (2013.01); *H01B 12/06* (2013.01); *Y10T 428/12618* (2015.01); *Y10T 428/31678* (2015.04)

(58) Field of Classification Search
CPC ..................................................... H01B 12/06
USPC ....................................................... 505/230
See application file for complete search history.

(56) References Cited

U.S. PATENT DOCUMENTS

| 5,039,478 A * | 8/1991 | Sankaranarayanan | B22D 23/003 |
| | | | 420/469 |
| 2004/0266628 A1* | 12/2004 | Lee et al. | 505/238 |
| 2007/0179063 A1* | 8/2007 | Malozemoff | H01L 39/143 |
| | | | 505/329 |
| 2009/0298696 A1* | 12/2009 | Otto | H01L 39/02 |
| | | | 505/230 |
| 2010/0075857 A1* | 3/2010 | Ayai | 505/230 |

FOREIGN PATENT DOCUMENTS

| CN | 101548345 A | 9/2009 |
| JP | 09-115355 A | 5/1997 |
| JP | 09-306255 A | 11/1997 |
| JP | 2011-113933 A | 6/2011 |
| JP | 2013-134856 A | 7/2013 |

OTHER PUBLICATIONS

Machine translation of 09-306255. 1997.*
Machine translation of 09-115355. 1997.*
International Search Report and Written Opinion dated Nov. 24, 2014 for PCT/US2014/050686 Filed Aug. 12, 2014.

* cited by examiner

*Primary Examiner* — Paul Wartalowicz

(57) ABSTRACT

In one embodiment a superconductor tape includes a substrate comprising a plurality of layers, an oriented superconductor layer disposed on the substrate, and an alloy coating disposed upon the superconductor layer, the alloy coating comprising one or more metallic layers in which at least one metallic layer comprises a metal alloy.

14 Claims, 5 Drawing Sheets

HIGH TEMPERATURE SUPERCONDUCTOR TAPE WITH ALLOY METAL COATING

FIELD

The present embodiments relate to superconducting materials and, more particularly, to superconducting tape and fabrication techniques therefore.

BACKGROUND

Superconducting wires or tapes have been developed based upon high temperature superconducting (HTc) materials which may have critical temperatures TC above 77 K, facilitating their use in cryogenic systems cooled by liquid nitrogen. In certain applications, such as use in superconducting fault current limiters (SCFCL), high temperature superconducting (HTS) tapes may experience high temperature excursions in the case of a fault, in which the superconducting layer undergoes a transition to non-superconducting state.

When a fault occurs in an SCFCL, due to the finite resistance acquired by the superconducting layer, current that is conducted almost exclusively through the superconductor layer under normal operation of the SCFCL is diverted into metallic layers that are in contact with the superconductor layer, which layers typically present lower resistance than the now-resistive superconductor layer. The current passing through the metallic layers during the fault condition may cause resistive heating that generates temperatures up to 400 C. or more in the HTS tape. As a result of high temperatures, roughening of metal surfaces as well as oxidation may take place in local spots or at a metal layer interface, leading to degradation of the metallic layers and reducing the lifetime of the HTS tape.

On the other hand, in order to effect a significant voltage drop along the length of the superconductor tape, it may be desirable to increase the sheet resistance of the metallic layers in the HTS tape. Although this could in principle be accomplished by decreasing the thickness of a metal layer such as copper, the reduced thickness may lead to increased susceptibility to agglomeration or other degradation that may shorten the HTS tape lifetime. It is with respect to these and other considerations that the present improvements are needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, a superconductor tape comprises a substrate comprising a plurality of layers, an oriented superconductor layer disposed on the substrate, and an alloy coating disposed upon the superconductor layer, the alloy coating comprising one or more metallic layers in which at least one metallic layer comprises a metal alloy.

In an additional embodiment, a method to form a superconductor tape includes forming a superconductor layer comprising an oriented superconductor material on a tape substrate, where the tape substrate and superconductor material define a first interface therebetween. The method further includes forming an alloy coating on the superconductor layer, where the alloy coating and superconductor layer define a second interface opposite the first interface, and the alloy coating comprising one or more metallic layers in which at least one metallic layer comprises a metal alloy.

DETAILED DESCRIPTION

Figure 1:
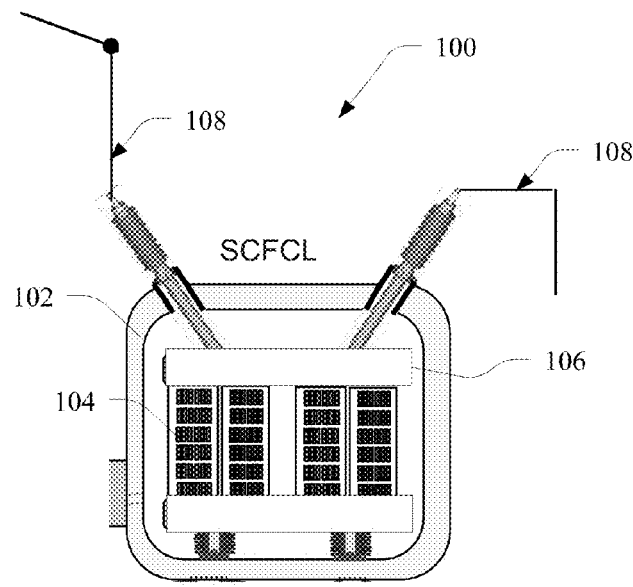
FIG. 1 depicts a current limiting system in accordance with one embodiment.

The present embodiments will now be described more fully hereinafter with reference to the accompanying drawings, in which some embodiments are shown. The subject matter of the present disclosure, however, may be embodied in many different forms and should not be construed as limited to the embodiments set forth herein. Rather, these embodiments are provided so that this disclosure will be thorough and complete, and will fully convey the scope of the subject matter to those skilled in the art. In the drawings, like numbers refer to like elements throughout.

To address some of the deficiencies in the aforementioned superconductor tapes, embodiments are described herein that provide improved structure for superconductor tapes as well as improved techniques for forming superconductor tapes. These embodiments may be especially suited to applications of superconductor tapes in which the tapes are subject to an AC voltage including in fault current limiters and other applications.

To address this situation, the present embodiments in particular provide superconductor tape structures that include an alloy coating containing one or more metal alloy layers. In particular, a metal alloy (herein also referred to simply as "alloy") coating is disposed in contact with a superconductor layer. As detailed below, the alloy layer(s) within an alloy coating provide improved robustness of the superconductor tape including, among others, improved resistance to "burnout" during fault conditions, increased sheet resistance, and improved properties of the underlying superconductor layer.

The term "alloy" as used herein refers to a mixture of a metal with one or more other elements, such as one or more additional metallic element. An alloy may be composed of a solid solution of two or more elements that form a single phase; a mixture of two or more phases, each of which may be a solid solution of two or more elements; one or more intermetallic compounds; or a mixture of any combination of the above. An intermetallic compound may be a "line" compound in which the ratio of the constituent elements does not vary, but may be a compound in which the ratio of constituent elements does vary. In the discussion to follow, examples are shown as to how by proper selection of alloy elements the combination of desirable superconductor tape properties can be tailored. The alloy coatings disclosed herein below include at least one alloy layer, and may contain a single alloy layer, a single alloy layer and additional non-alloy layer(s), multiple alloy layers and multiple non-alloy layers, and so forth. In the embodiments to follow examples of silver or copper layers that are alloyed with a single element are provided for various alloying elements. However, the present embodiments include alloys in which two or more such alloying elements are alloyed with a material such as copper or silver.

FIG. 1 depicts an architecture of a superconducting fault current limiter (SCFCL) system 100 consistent with embodiments of the disclosure. The SCFCL system 100 includes an SCFCL 102, which may be a conventional SCFCL except as otherwise noted herein with respect to the description to follow. The SCFCL system 100 further includes a protection element 106 that contains superconducting tapes arranged according to various embodiments. The SCFCL 102 is arranged in series with a transmission line 108 that is designed to conduct load current. Under normal operation mode a load current may periodically, occasionally, or continuously pass through the SCFCL system 100. The load current in normal operation mode exhibits a current level such that the superconductor elements 104 remain in a superconducting state and therefore transmit the load current through the superconductor elements 104 with zero resistance when the load current passes through the SCFCL 102. Accordingly, the load current is transmitted with relatively lower resistance through the SCFCL, which includes resistive points including normal state metals and connection points.

The superconductor elements 104 are fabricated using (HT$_C$) tapes. By way of background, an HTc tape is used in situations in which a device such as an SCFCL is cooled, typically to liquid nitrogen boiling temperature (77 K), which is below the critical temperature of the superconductor material used to fabricate the HTc tape. The SCFCL transmits electrical current without resistance through the superconductor (HT$_C$) tape when the electrical current is less than critical current (J$_C$), which is a function of the superconductor material from which the tape is fabricated and the tape geometry. Under fault conditions, the electrical current conducted through the SCFCL 102 undergoes a surge, exceeding J$_C$ and causes the superconductor material to transform to finite state resistance and divert current through metal contact layers, as noted. In conventional HT$_C$ tape structures, the high temperatures that evolve during a fault when current is diverted through the metal contact layers may transform the microstructure of the metal layer(s) causing metal atom diffusion, grain growth, thermally induced stress, which processes can result in layer agglomeration, generation of voids, discontinuities. In addition, depending upon the ambient when a fault occurs, oxidation of the metal layer may take place. Such collection of phenomena are also referred to herein as "burnout" and may take place after a single fault event or after multiple fault events.

Figure 2A:
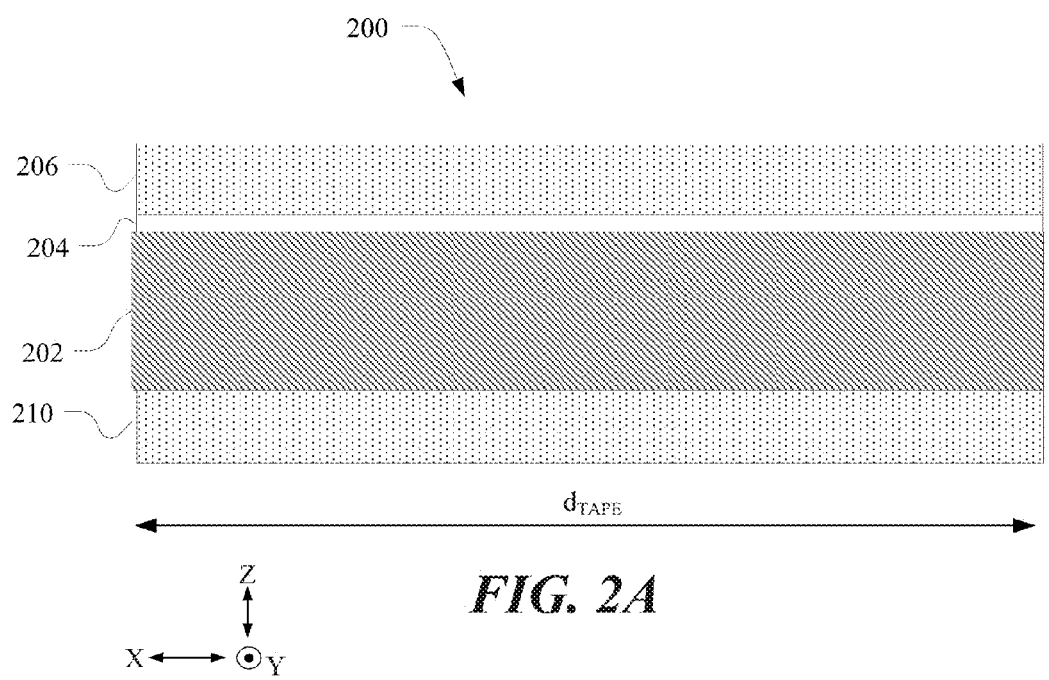
FIG. 2A depicts an embodiment of a coated superconductor tape having an alloy coating.

Consistent with the present embodiments, metal coatings used to construct the superconductor elements 104 include at least one alloy layer that has improved resistance to burnout. In various embodiments the alloy layer forms part of a coated conductor structure which has metal layers that surround an inner superconductor layer of the superconductor tape. FIG. 2A depicts one embodiment of a superconductor tape 200 in which a superconductor layer 204 is disposed on a substrate 202, which includes multiple layers as described below. The substrate 202 by virtue of its constituent layers forms a template for growth of a highly oriented superconductor layer. The terms "oriented" or "highly oriented" as used herein refer to the quality of having a high degree of crystallographic orientation, such as a high degree of bi-axial orientation in which one crystallographic axis lies parallel to a single direction. Suitable material for superconductor layer 204 includes, for example, ReBa$_2$Cu$_3$O$_{7-x}$ where R is a rare earth element, or Bi$_2$Sr$_2$Ca$_{n-1}$Cu$_n$O$_{4+2n+x}$. Each of these families of materials includes certain compositions whose critical temperature (T$_C$) and critical current capability are suitable for use in a current limiter operated at liquid nitrogen temperature. Disposed on the superconductor layer 204 is an alloy coating 206 that is configured to conduct current such as a transient fault current that may develop during a fault condition in which the superconductor layer 204 transitions to a non-superconducting state. As detailed below, the composition and/or microstructure of the alloy coating 206 is such that the alloy coating 206 is more resistant to burnout than a conventional metal layer or stack of layers used in superconductor tapes such as silver or copper. In various embodiments, the alloy coating extends around the superconductor tape 200 such that a coating 210, which may be the same material as that of the alloy coating 206, is disposed adjacent the substrate 202 on a side opposite that in which the superconductor layer 204 is disposed. This results in a structure in which the superconductor layer 204 and substrate 202 are surrounded by an alloy material. However, in the FIGs. to follow, the coating 210 is omitted for clarity.

Figure 2B:
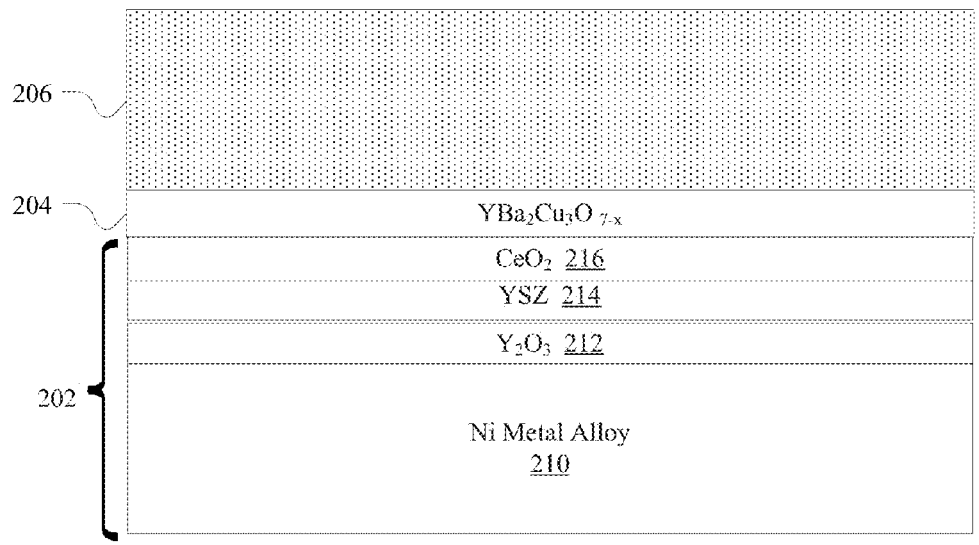
FIG. 2B depicts one variant of the embodiment of FIG. 2A.
Figure 2C:
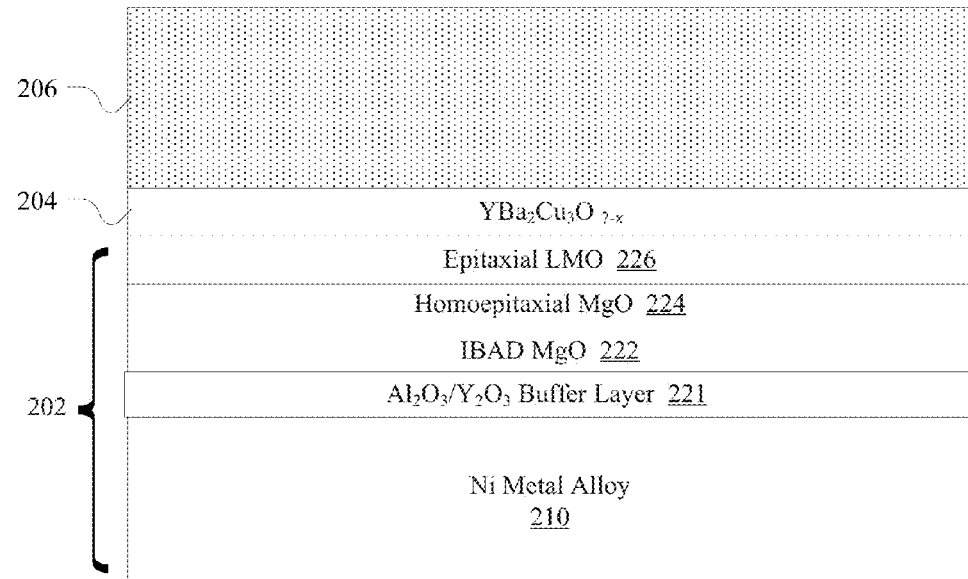
FIG. 2C depicts another variant of the embodiment of FIG. 2A.

FIGS. 2B and 2C present variants of the superconductor tape 200 in which the superconductor layer 204 is YBa$_2$Cu$_3$O$_{7-x}$, which material exhibits a large critical current. In the embodiment of FIG. 2B the substrate 202 includes a base metal alloy layer 210, Y$_2$O$_3$ layer 212 disposed on the base metal alloy layer 210, yttrium stabilized zirconia (YSZ) layer 214 disposed upon the Y$_2$O$_3$ layer 212, and CeO$_2$ layer 216 disposed upon the YSZ layer 214. As illustrated specifically in FIGS. 2B, 2C, examples of suitable material for the base metal alloy layer 210 include nickel based alloys such as Hastealloy C-276. However, other metal alloys may also be used. The CeO$_2$ layer 216 represents the layer upon which the superconductor layer 204 is disposed.

In the example of FIG. 2C, the substrate 202 includes the base metal alloy layer 210, Al$_2$O$_3$/Y$_2$O$_3$ Buffer Layer 221, MgO layer formed by ion beam-assisted deposition (IBAD MgO 222), homoepitaxial MgO layer 224 disposed the IBAD MgO 222, and epitaxial LaMnO$_3$ (LMO)) layer 226. The epitaxial LMO layer 226 represents the layer upon which the superconductor layer 204 is disposed. In each case, the oxide layer upon which the superconductor layer 204 is YBa$_2$Cu$_3$O$_{7-x}$ may be bi-axially textured such that the superconductor layer 204 is YBa$_2$Cu$_3$O$_{7-x}$ is formed as an epitaxial layer having a high critical current capability. Notably the embodiments are not limited to the specific film stacks depicted in FIGS. 2B and 2C.

In various embodiments, the superconductor tape 200 is designed to support a critical current as high as about 1000 Amps (A) per centimeter width of superconductor tape. Referring again to FIG. 2A the superconductor tape width $d_{TAPE}$ reflects the dimension of the superconductor tape 200 in a direction perpendicular to the direction of current flow, which is in the Y-direction for the Cartesian coordinate system shown. For a layer thickness (along the Z-direction) of about 1 micrometer, a critical current of 1000 A/cm width corresponds to a critical current density of $10^7$ Amp/cm$^2$. In order to support high critical current capability the superconductor tape 200 is configured to support a high current surge that may take place during a fault condition. For example, in embodiments in which $d_{TAPE}$ of superconductor tape 200 is about 1 cm, the current density would exceed 1000 A (and may temporarily be much higher in a fault condition) before the superconductor layer 204 transitions to a non-superconducting state, thereby diverting current through the alloy coating 206. Accordingly, in various embodiments, the alloy coating 206 is designed to withstand current excursions that exceed at a minimum 1000 A.

Figure 3A:
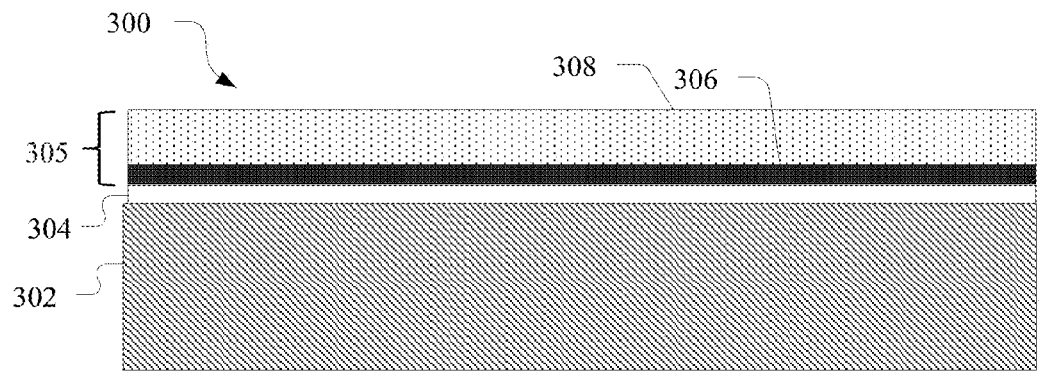
FIG. 3A depicts one embodiment of a bilayer alloy coating.
Figure 3B:
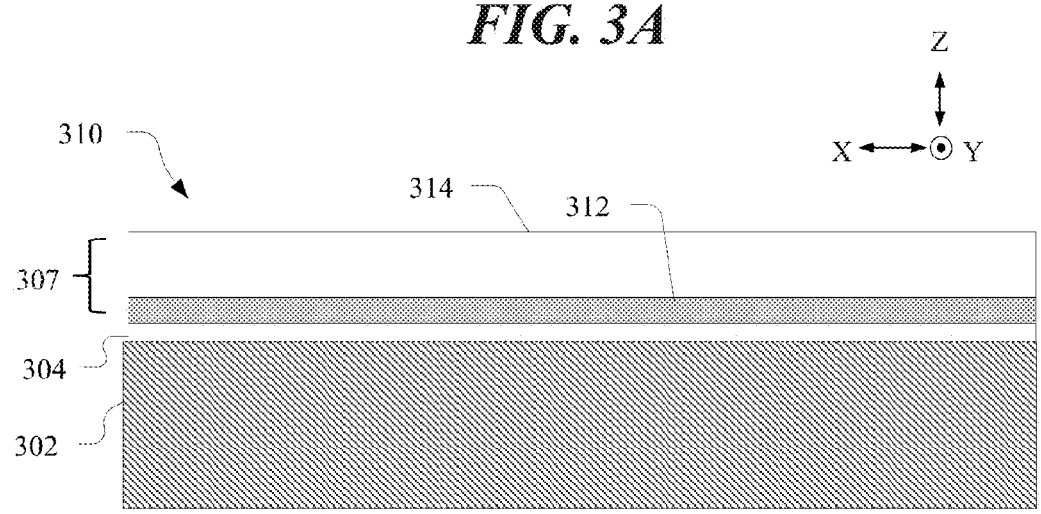
FIG. 3B depicts another embodiment of a bilayer alloy coating.
Figure 3C:
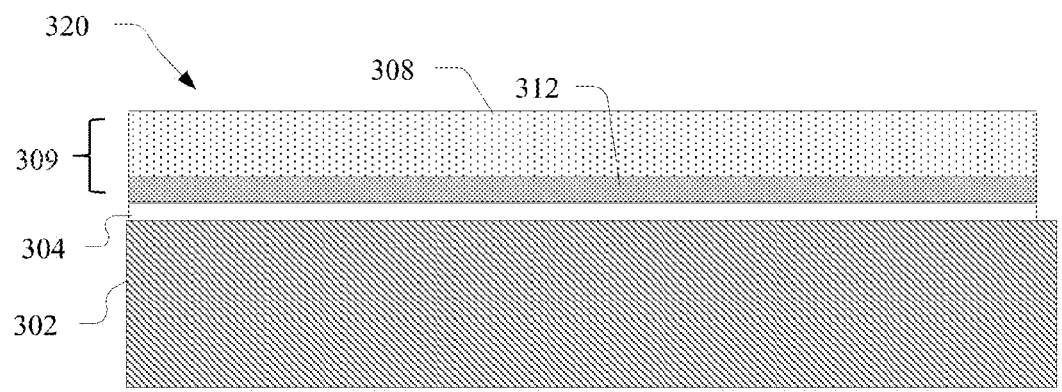
FIG. 3C depicts a further embodiment of a bilayer alloy coating.

In some embodiments, the alloy coating 206 is a bilayer stack that includes at least one layer composed of an alloy. FIGS. 3A, 3B and 3C present variants of a superconductor tape having an alloy-containing bilayer stack. In FIG. 3A, there is shown an end cross-sectional view of a superconductor tape 300 that includes a superconductor layer 304 disposed on a substrate 302. In this example, the bilayer stack 305 formed on the superconductor layer 304 includes a metal layer 306 disposed on the superconductor layer that is not an alloy, and an alloy layer 308 disposed on the metal layer 306. In FIG. 3B, there is shown an end cross-sectional view of a superconductor tape 310 that includes a variant of a bilayer stack 307 formed on the superconductor layer 304 in which a metal layer 312 in contact with the superconductor layer 304 is an alloy. The superconductor tape 310 also includes a metal layer 314 disposed on the metal layer 312 that is not an alloy. In FIG. 3C, there is shown an end cross-sectional view of a superconductor tape 320 that includes a variant of a bilayer stack 309 formed on the superconductor layer 304 in which a metal layer 312 in contact with the superconductor layer 304 is an alloy and the alloy layer 308 disposed on the metal layer 312.

Consistent with various embodiments the alloy layers depicted in FIGS. 3A-3C may be fabricated by any convenient method including plating, chemical vapor deposition, or physical vapor deposition. The embodiments are not limited in this context.

Each of the configurations of a superconductor tape shown in FIGS. 3A-3C is effective to reduce burnout that may otherwise be caused when excessive temperature is generated in the respective superconductor tape during a fault condition, for example. In some embodiments of a superconductor tape in which the superconductor layer is covered by a bilayer metal structure or alloy coating, the layer within the bilayer metal alloy coating that is in contact with the superconductor layer is a silver-containing layer, and the outer layer disposed on the silver-containing layer is a copper-containing layer. In exemplary configurations the silver-containing layer has a thickness in the range of several tenths of one micrometer up to about two micrometers, and the copper-containing layer has a thickness in the range of 5 micrometers up to 50 micrometers. The silver-containing layer is effective in maintaining low contact resistance between the superconductor layer and bilayer metal stack. The silver-containing layer is also effective to prevent interdiffusion of the copper containing layer and superconductor layer, which interdiffusion may degrade the superconducting properties of the superconductor layer. On the other hand, the copper-containing layer, by virtue of its greater thickness and the low specific resistivity of copper, is effective in carrying the bulk of any fault current that may develop.

In some embodiments, a silver alloy layer of a superconductor tape is fabricated with an alloying element that forms a conductive oxide under an oxidizing environment. Examples of such alloy layers are alloys of Ag and Sn or alloys of Ag and Zn. In particular, embodiments, exemplary compositions for such alloys are about 0.5 mole % to about 30 mole % of either Sn or Zn. At relatively lower concentrations, each of these alloys forms a single phase solid solution with silver. For example, the Ag—Zn binary system forms a single phase face centered cubic (fcc) structure when mole fraction of Zn is less than about 25%, and the Ag—Sn binary system forms a single phase when mole fraction of Sn is less than about 15%. During a fault condition, high temperatures generated by excessive current within the superconductor tape combined with oxidizing ambient that may typically surround the superconductor tape, may result in oxidation of the silver containing layer. Because an Ag—Zn or Ag—Sn alloy layer each contain elements that form conductive oxides, in these embodiments, any oxidation that takes place in the silver alloy layer may nevertheless result in a conductive layer that in particular maintains acceptable contact resistance with the underlying superconductor layer.

Figure 4A:
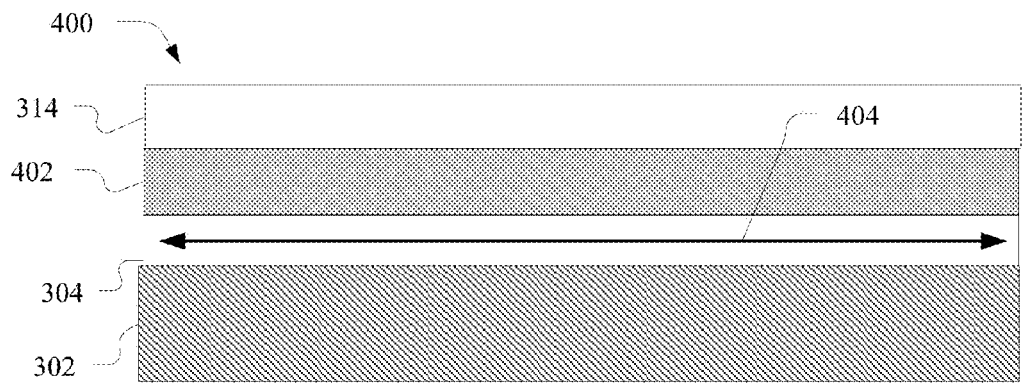
FIG. 4A depicts a scenario for operation of a coated superconductor tape having a bilayer alloy coating under normal conditions.
Figure 4B:
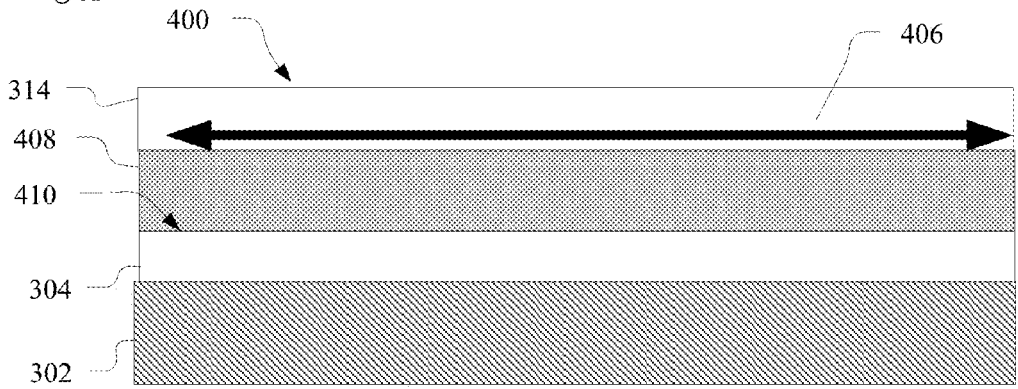
FIG. 4B depicts one scenario for formation of a conductive oxide in the coated superconductor tape of FIG. 4A during a fault condition.
Figure 4C:
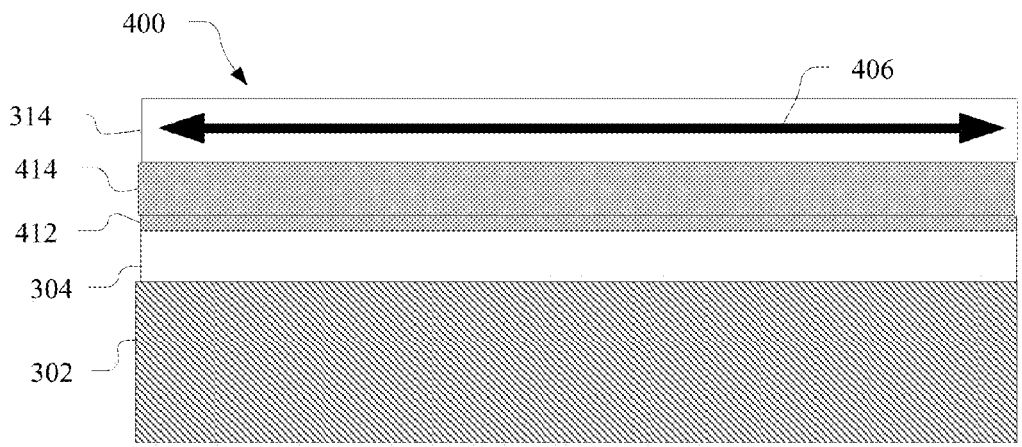
FIG. 4C depicts another scenario for formation of a conductive oxide in the coated superconductor tape of FIG. 4A during a fault condition.

To illustrate this point, FIGS. 4A-4C collectively present two different scenarios for oxidation of a silver alloy layer caused by a fault condition or other condition that generates heating of the silver alloy layer. In FIG. 4A there is shown a side cross-sectional view of a superconductor tape 400, which tape may include a copper layer, or overlayer (not shown to scale), such as the layer 314, which is not alloyed. However in other embodiments, the copper layer may be an alloy layer. As used herein, unless otherwise noted, the terms "copper layer" and "silver layer" may include any respective layer in which the molar fraction of that layer is greater than 50% copper or greater than 50% silver respectively. Thus, a "copper layer" may be pure copper or may contain one or more additional elements whose total molar fraction is less than 50% of the copper layer. The superconductor tape 400 includes a silver alloy layer 402 which may be formed from a solid solution of Ag—Zn or Ag—Sn in different embodiments. In particular embodiments, the mole fraction of Zn or Sn within the silver alloy layer 402 is 30% or below. The superconductor tape 400 is operating under normal conditions in which the ambient is cooled to cryogenic temperatures such as liquid nitrogen temperature (77 K). An electrical current 404 is transported through the superconductor tape 400 at a current level below JC, such that the superconductor layer 304 remains in a superconducting state, such that the electrical current 404 is conducted within the superconductor layer 304 along the long direction (parallel to the Y-direction). Under these conditions, the electrical current 404 traverses the superconductor layer 304 without resistance and little or no resistive heating occurs within the superconductor tape 400.

In FIG. 4B a fault condition has developed in which excessive current has rendered the superconductor layer 304 in a non-superconducting state such that the electrical current 406 is conducted within the copper layer 314 and partially within the silver layer. The electrical current 406 is sufficient to generate resistive heating such that the superconductor tape 400 reaches elevated temperatures. In some examples, the superconductor tape 400 may reach a temperature of 300° C., 400° C., or higher. This elevated temperature causes oxidation of the silver layer producing an oxidized layer 408. Because the silver alloy layer 402 contains tin or zinc, the oxidized layer 408 remains electrically conducting, and in particular has an acceptable contact resistance at the interface 410. Although silver itself is capable of forming a conductive oxide, the addition of tin or zinc may facilitate formation of a more conductive layer.

In FIG. 4C there is shown another scenario in which a fault condition has developed for the structure of FIG. 4A, such that the electrical current 406 is conducted within the copper layer 314 and partially within the silver layer. In this example, the elevated temperature that results during the fault condition has generated from the original silver alloy layer 402 an interface oxide layer 412 in addition to a residual layer 414. The interface oxide layer 412 may comprise an Sn-rich oxide layer or alternatively a Zn-rich oxide layer in which the Sn content or alternatively the Zn content is higher than in the residual layer 414. The interface oxide layer 412 may exhibit low contact resistance such that the superconductor tape 400 is capable of properly conducting current between the superconductor layer 304 and copper layer 314 in the event of entering or exiting out of fault conditions in which electrical current is primarily directed through the copper layer 314. Depending upon the silver alloy used and the mole fraction of Sn or Zn, as well as the exact fault conditions the scenario of FIG. 4B or 4C may be favored. In either case, the silver alloy layer presents a more robust material that is able to withstand oxidizing events and maintain acceptable conductivity properties.

Figure 5:
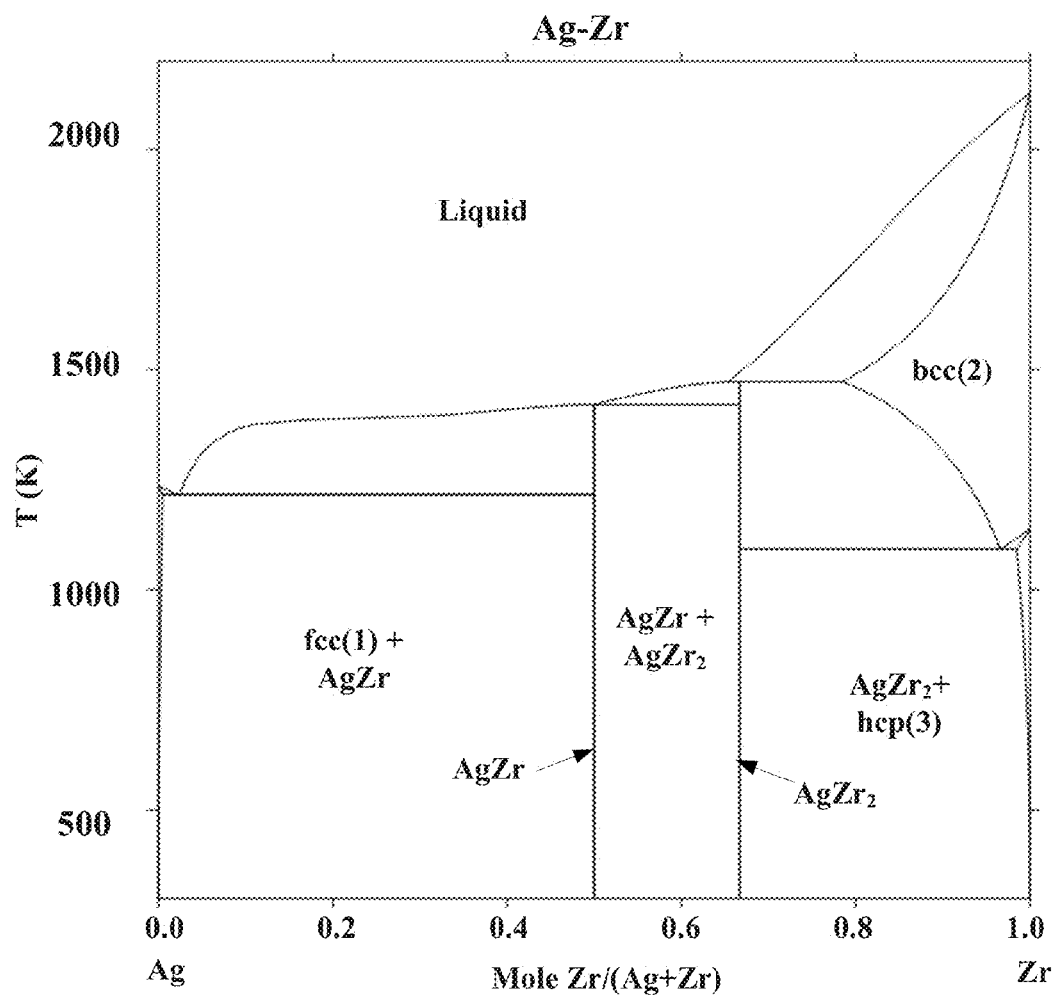
FIG. 5 depicts a binary phase diagram for the Ag—Zr system.

In additional embodiments a silver alloy layer of a superconductor tape is fabricated with an alloying element that forms a precipitate within the silver alloy layer. Such precipitates may be effective in maintaining stability of the silver alloy layer under high temperature conditions (>~250 C) that develop during a fault condition. In particular embodiments, the alloying element is chosen based on the tendency to form an intermetallic compound with silver, which compound may tend to segregate into precipitates under certain conditions. In one example, Au—Zr alloy layers are formed for Zr molar concentrations up to about 25%. FIG. 5 depicts a portion of the binary equilibrium phase diagram for the Ag—Zr system. It can be seen that for molar concentrations below 50% Zr a two phase region exists that is made of a pure silver phase and a binary AgZr compound. Accordingly, in smaller concentrations of Zr (<~25%) the AgZr phase can be expected to segregate into isolated regions, such as in grain boundary precipitates of a silver matrix phase. When such a microstructure forms, the AgZr precipitates act to pin grain growth of silver grains in the matrix phase when the Ag—Zr alloy layer is subjected to elevated temperatures. This helps maintain the Ag-Alloy layer as a smooth layer under elevated temperature thereby reducing the tendency of the layer to agglomerate.

In further embodiments of a superconductor tape silver alloy layer, alloying elements are added to silver that are effective in improving the properties of the underlying superconductor layer. In some embodiments, Zr or Ta are added to silver in molar concentrations of about 0.5% to 10% to form a metal alloy layer. The embodiments are not limited in this context.

During fabrication of a superconductor tape, when a silver alloy layer containing Zr or Ta is initially formed on a superconductor layer, the Zr or Ta may be dispersed within a silver matrix such as in an internetallic compound as noted above. When the superconductor tape is subsequently subjected to elevated temperatures, such as about 300° C. for one second or more, Zr or Ta may react with at least a portion of the underlying superconductor layer, such as a $YBa_2Cu_3O_{7-x}$ (YBCO) layer, and may form a precipitate phase such as $ZrBaO_x$ or $TaBaO_x$ that is effective in creating flux pinning centers within the superconductor layer. Flux pinning is the phenomenon in which magnetic flux lines do not move (become trapped, or "pinned") in spite of the Lorentz force that is acting on them inside an electric current carrying superconductor. Flux pinning does not occur in Type I superconductors but does occur in Type II superconductors such as YBCO. In particular, flux pinning occurs when there are crystallographic defects resulting from grain boundaries of impurities, for example. Flux pinning may be desirable in high temperature ceramic superconductor materials to prevent "flux creep" which can create a pseudo-electric resistance within the superconductor layer and depress the critical current density and critical field to transform the superconductor layer into a non-superconducting state. Thus, in various embodiments, when a silver alloy layer containing Zr or Ta is subject to temperatures above 300 C, for example, either during a fault event or due to deliberate annealing of the silver alloy layer, the flux pinning properties of the underlying type II oxide superconductor may be improved.

In other embodiments an alloying element or elements is added to a copper layer, which alloying element is effective to reducing copper layer grain growth, roughening, and/or agglomeration. Examples of effective alloying elements include Sn, Zn and other elements that form solid solutions with copper; and Zr, Ta, and other elements that may form precipitate phases. The choice of alloying element may be based in part on the desired resistivity of the copper layer to be achieved by the alloying element. For example, additions of elements that form a solid solution with copper may result in relatively smaller increases in resistance in comparison to pure copper layers, whereas addition of elements that form precipitates may produce a relatively greater increase in resistance.

In various embodiments the addition of alloying element is effective in engineering an increase in sheet resistance in the metal layer(s) disposed on the superconductor layer of the superconductor tape. This is useful to increase the voltage drop per unit length of superconductor tape and thereby reduce the length of superconductor tape required in a given SCFCL. The incorporation of an alloying element in a copper layer of a copper/silver bilayer system may be effective to increase sheet resistance in two ways. As a first matter it is to be noted that the copper overlayer may be many times thicker than the silver underlayer that contacts the superconductor layer. In some tape structures, for example, the copper layer may have a thickness of about 20 µm and the silver layer 1 µm. Accordingly, because pure copper and pure silver have similar resistivity, the sheet resistance of the Cu/Ag stack is dominated by the sheet resistance of the copper overlayer. With this in mind, in various embodiments an alloying element such as Zr is added to increase the resistivity of the copper overlayer.

Secondly, by virtue of the increased resistance to agglomeration or other unwanted layer changes that is imparted to a copper overlayer when alloyed with certain elements such as Zr, in further embodiments the total layer thickness of copper in a superconductor tape may be reduced. For example in some embodiments a copper alloy having 10 micrometer thickness may be used as an overlayer to conduct fault current in a superconductor tape. With the addition of an appropriate amount of Zr, such as several percent up to about twenty percent, the 10 micrometer thick copper alloy layer may resist roughening or agglomeration under high temperature conditions that are effective to roughen a thicker layer such as a twenty micrometer thick pure copper film.

In various additional embodiments a copper/silver bilayer system is composed of both a copper alloy and a silver alloy. The alloying elements of each layer may be tailored to optimize a desired combination of coating properties. In some embodiments more than one element may be added to a respective copper or silver layer. For example, an alloying element such as tin may be added to the silver layer to optimize conductivity at the interface while zirconium is added to improve flux pinning in the underlying superconductor layer.

In summary, the present embodiments provide a superconductor tape that is configured with a single layer or multilayer metal alloy coating for improved tape properties, including resistance to degradation during fault conditions. In some embodiments the metal alloy coating provides additional performance benefits such as increased voltage drop per unit tape length, and improved flux pinning in the underlying superconductor layer. The superconductor tapes of the present embodiments may be fabricated using various techniques including those techniques to fabricate metal coatings in conventional superconducting tapes.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. A superconductor tape, comprising:
a substrate comprising a plurality of layers;
an oriented superconductor layer disposed on the substrate; and
an alloy coating disposed upon the superconductor layer, the alloy coating comprising two or more metallic layers, including a copper layer/silver layer bilayer structure, wherein a silver alloy layer of the copper layer/silver layer bilayer structure contacts the oriented superconductor layer, wherein a copper layer of the copper layer/silver layer bilayer structure is disposed directly in contact with the silver alloy layer and does not contact the superconductor layer, and wherein the copper layer comprises a copper alloy having an alloying element in a precipitate phase, the silver alloy comprising Ta, the Ta having a molar fraction between 0.5 and 10.0%.

2. The superconductor tape of claim 1, the copper alloy comprising a mixture of copper and zirconium, copper and tin, or copper and zinc.

3. The superconductor tape of claim 2, comprising a mixture of copper and zirconium having a molar fraction of zirconium less than or equal to 10%.

4. The superconductor tape of claim 1, the superconductor layer comprising $RBa_2Cu_3O_{7-x}$ where R is a rare earth element.

5. The superconductor tape of claim 1, the copper layer comprising a thickness of 10 μm or less.

6. The superconductor tape of claim 1, the superconductor layer comprising:
$RBa_2Cu_3O_{7-x}$ where R is a rare earth element; wherein the silver alloy is effective to generate Ta-containing oxide precipitates when the superconductor tape is heated to above 300° C. for about one second or more.

7. The superconductor tape of claim 1, the silver alloy comprising Sn or Zn, the Sn or Zn having a molar fraction of between 0.5 and 30%.

8. The superconductor tape of claim 1, the silver alloy comprising AgZr precipitates dispersed within a matrix of Ag.

9. A superconductor tape, comprising:
a substrate comprising a plurality of layers;
an oriented superconductor layer disposed on the substrate; and
an alloy coating disposed upon the superconductor layer, the alloy coating comprising two or more metallic layers, including a copper layer/silver layer bilayer structure, wherein a silver alloy layer of the copper layer/silver layer bilayer structure contacts the oriented superconductor layer, wherein a copper layer of the copper layer/silver layer bilayer structure is disposed directly in contact with the silver alloy layer and does not contact the superconductor layer, and wherein the copper layer comprises a copper alloy having an alloying element in a precipitate phase, the silver alloy comprising Zr, the Zr having a molar fraction of 6 % to to 10.0 %.

10. The superconductor tape of claim 9, the superconductor layer comprising:
$RBa_2Cu_3O_{7-x}$ where R is a rare earth element; wherein the silver alloy is effective to generate Zr-containing oxide precipitates when the superconductor tape is heated to above 300° C. for about one second or more.

11. The superconductor tape of claim 9, the silver alloy comprising AgZr precipitates dispersed within a matrix of Ag.

12. A superconductor tape, comprising:
a substrate comprising a plurality of layers;
an oriented superconductor layer disposed on the substrate; and
an alloy coating disposed upon the superconductor layer, the alloy coating comprising two or more metallic layers, including a copper layer/silver layer bilayer structure, wherein a silver alloy layer of the copper layer/silver layer bilayer structure contacts the oriented superconductor layer, wherein a copper layer of the copper layer/silver layer bilayer structure is disposed directly in contact with the silver alloy layer and does not contact the superconductor layer, and wherein the copper layer comprises a copper alloy, the copper alloy comprising a mixture of copper and zirconium, copper and tin, or copper and zinc, the silver alloy comprising Ta, the Ta having a molar fraction between 0.5 and 10.0%.

13. The superconductor tape of claim 12, comprising a mixture of copper and zirconium having a molar fraction of zirconium less than or equal to 10%.

14. The superconductor tape of claim 12, the copper alloy having an alloying element in a precipitate phase.

\* \* \* \* \*